(12) United States Patent
Park et al.

(10) Patent No.: US 11,552,596 B2
(45) Date of Patent: Jan. 10, 2023

(54) ODD HARMONIC GENERATION DEVICE AND METHOD

(71) Applicants: IMEC VZW, Leuven (BE); VRIJE UNIVERSITEIT BRUSSEL, Brussels (BE)

(72) Inventors: Sehoon Park, Heverlee (BE); Jan Craninckx, Boutersem (BE); Pierre Wambacq, Groot-Bijgaarden (BE); Davide Guermandi, Heverlee (BE)

(73) Assignees: IMEC VZW, Leuven (BE); VRIJE UNIVERSITEIT BRUSSEL, Brussels (BE)

( * ) Notice: Subject to any disclaimer, the term of this patent is extended or adjusted under 35 U.S.C. 154(b) by 0 days.

(21) Appl. No.: 17/328,181

(22) Filed: May 24, 2021

(65) Prior Publication Data
US 2021/0399685 A1    Dec. 23, 2021

(30) Foreign Application Priority Data
Jun. 17, 2020  (EP) .................................... 20180442

(51) Int. Cl.
*H03B 19/14*     (2006.01)
*H03K 5/00*      (2006.01)

(52) U.S. Cl.
CPC ......... *H03B 19/14* (2013.01); *H03K 5/00006* (2013.01)

(58) Field of Classification Search
CPC ...... H03B 19/14; H03B 5/1228; H03B 19/00; H03B 2200/007; H03B 5/1215; H03B 5/1243; H03B 5/1212; H03B 27/00; H03K 5/0006; H03D 7/1458; H03D 7/1441; H03D 7/165; H03D 7/1433; H03D 7/1466; H03D 7/00; H03F 1/56; H03F 3/193; H03F 3/19; H03F 2200/451; H03F 3/189;
(Continued)

(56) References Cited

U.S. PATENT DOCUMENTS 7,920,606 B2    4/2011   Starodoumov et al.
8,933,732 B2    1/2015   Lee et al.
9,318,870 B2    4/2016   Lei et al.
(Continued)

FOREIGN PATENT DOCUMENTS

CN    110855244 A    2/2020
JP    2001272704 A   10/2001
(Continued)

OTHER PUBLICATIONS

Extended European Search Report and Written Opinion, Application No. EP20180442.4, dated Nov. 26, 2020, 13 pages.
(Continued)

*Primary Examiner* — John W Poos
(74) *Attorney, Agent, or Firm* — McDonnell Boehnen Hulbert & Berghoff LLP

(57) ABSTRACT

An odd harmonic generation device is provided. The odd harmonic generation device includes an even harmonic generation unit and a mixer. In this context, the even harmonic generation unit is configured to generate two even harmonic signals on the basis of a fundamental signal. In addition to this, the mixer is configured to mix the fundamental signal with the two even harmonic signals to generate a desired odd harmonic signal.

18 Claims, 4 Drawing Sheets

(58) Field of Classification Search
CPC .. H03F 1/0205; H03F 2200/222; H03F 3/191; H03F 2200/387; H03F 1/565; H03L 7/24

See application file for complete search history.

(56) References Cited

U.S. PATENT DOCUMENTS

| | | | |
|---|---|---|---|
| 9,680,454 B2* | 6/2017 | Chueh | H03K 5/00006 |
| 2007/0049236 A1 | 3/2007 | Naito | |
| 2009/0079474 A1* | 3/2009 | Rofougaran | H03B 19/00 327/122 |
| 2011/0227612 A1* | 9/2011 | Chiesa | H03B 19/14 327/119 |
| 2019/0158075 A1* | 5/2019 | Lee | H03B 19/14 |
| 2019/0348974 A1* | 11/2019 | Bao | H03H 7/0115 |

FOREIGN PATENT DOCUMENTS

| | | | |
|---|---|---|---|
| WO | 2014029413 A1 | 2/2014 | |
| WO | 2014035342 A1 | 3/2014 | |
| WO | 2018141398 A1 | 8/2018 | |
| WO | WO-2018141398 A1 * | 8/2018 | H03B 19/14 |

OTHER PUBLICATIONS

Zheng, You, and Cados E. Saavedra. "A bipolar MMIC frequency tripler." In 2008 7th International Caribbean Conference on Devices, Circuits and Systems, pp. 1-4. IEEE, 2008.

Tu, Chih-Ho, Sheng-Wen Chen, Hong-Wei Kao, and Janne-Wha Wu. "Mixer-based injection-locked frequency tripler." In 2017 IEEE International Symposium on Radio-Frequency Integration Technology (RFIT), pp. 141-143. IEEE.

Ghouchani, Shadi Saberi, and Jeyanandh Paramesh. "A wideband millimeter-wave frequency doubler-tripler in 0 13-μm CMOS." In 2010 IEEE Radio Frequency Integrated Circuits Symposium, pp. 65-68. IEEE, 2010.

Koon, Hong-sun, and Youngcheol Park. "Design of a Dual mode Three-push Triplet Using Stacked FETs with Amplifier mode operation." Journal of IKEEE 22, No. 4 (2018): 1088-1092.

Mizadeh, Amirreza, Milad Frounchi, and Ali Medi. "A V-band MMIC doubler using a 4th harmonic mixing technique." IEEE Microwave and Wireless Components Letters 26, No. 5 (2016): 355-357.

Shirazi, Amir Hossein Masnadi, Amir Nikpaik, Reza Molavi, Shahriar Mirabbasi, and Sudip Shekhar. "A Class-C self-mixing-VCO architecture with high tuning-range and low phase-noise for mm-wave applications." In 2015 IEEE Radio Frequency Integrated Circuits Symposium (RFIC), pp. 107-110. IEEE, 2015.

Pushpa, Kumari, and Priyanka Mondal. "A frequency triplet with suppressed harmonics for millimeter-wave applications." In 2018 3rd International Conference on Microwave and Photonics (ICMAP), pp. 1-2. IEEE, 2018.

\* cited by examiner

ODD HARMONIC GENERATION DEVICE AND METHOD

CROSS-REFERENCE TO RELATED APPLICATIONS

The present application is a non-provisional patent application claiming priority to European Patent Application No. 20180442.4, filed on Jun. 17, 2020, the contents of which are hereby incorporated by reference.

FIELD OF THE DISCLOSURE

The disclosure relates to an odd harmonic generation device and an odd harmonic generation method.

BACKGROUND

Generally, in times of an increasing number of electrical applications requiring an odd harmonic signal such as a third harmonic signal, there is a growing need of an odd harmonic generation device and an odd harmonic generation method in order to provide odd harmonic signals for such applications.

For instance, Ghouchani and Paramesh (2010) show in their paper "A Wideband Millimeter-Wave Frequency Doubler-Tripler in 0.13-μm CMOS," published on IEEE Radio Frequency Integrated Circuits Symposium, 2010, pp 65-68, a combined frequency doubler and tripler for wideband millimeter wave frequency generation in complementary metal-oxide semiconductor. The circuit consists of a push-push field-effect transistor frequency doubler along with a single-balanced mixer based frequency tripler. In this context, the third harmonic is generated by mixing the second harmonic from a doubler output with the fundamental input Disadvantageously, especially due to the mixing, the respective conversion gain is reduced, which leads to inefficiencies.

SUMMARY

Accordingly, there is an object to provide an odd harmonic generation device and an odd harmonic generation method, whereby both a high conversion gain and a high efficiency are achieved.

This object is solved by the features of the first independent claim for an odd harmonic generation device and the features of the second independent claim for an odd harmonic generation method. The dependent claims contain further developments.

According to a first aspect of the disclosure, an odd harmonic generation device is provided. The odd harmonic generation device comprises an even harmonic generation unit and a mixer. In this context, the even harmonic generation unit is configured to generate at least two even harmonic signals on the basis of a fundamental signal. In addition to this, the mixer is configured to mix the fundamental signal with at least two of the at least two even harmonic signals to generate an odd harmonic signal.

According to a first example of the first aspect of the disclosure, the even harmonic generation unit is configured to shift at least one of the fundamental signal and the at least two even harmonic signals, for example at least one of the at least two even harmonic signals, in phase before the mixing with the aid of the mixer. Alternatively, the odd harmonic generation device comprises a phase shifting unit. In this context, the phase shifting unit is configured to shift at least one of the fundamental signal and the at least two even harmonic signals, for example at least one of the at least two even harmonic signals, in phase before the mixing with the aid of the mixer. An I/Q signal generation is not required, which can lead to an increased efficiency. The even harmonic generation unit may comprise the phase shifting unit. The phase shifting unit may be part of the even harmonic generation unit.

According to a second example of the first aspect of the disclosure, the at least two even harmonic signals are shifted in phase with regard to each other in a manner that corresponding signal portions are constructively added with respect to the desired odd harmonic signal after the mixing at the output of the mixer. Conversion gain can further be increased.

According to a further example of the first aspect of the disclosure, the odd harmonic generation device comprises a transconductance stage. In this context, the transconductance stage is configured to couple the even harmonic generation unit to the mixer. In addition to this or as an alternative, the transconductance stage is configured to generate at least one harmonic, for example at least one even harmonic, of its respective input. Further additionally or further alternatively, the transconductance stage is configured to amplify its respective input and/or at least one component, for example at least one even harmonic component, of its respective input. Inefficiencies can further be reduced. The even harmonic generation unit may comprise the transconductance stage. The transconductance stage may be part of the even harmonic generation unit.

According to a further example of the first aspect of the disclosure, the even harmonic generation unit comprises a frequency doubler, for example a transistor-based frequency doubler, a field-effect transistor-based frequency doubler, or a p-type or n-type metal-oxide semiconductor field-effect transistor-based frequency doubler. Complexity can be reduced, thereby increasing efficiency.

According to a further example of the first aspect of the disclosure, in the case of a p-type metal-oxide semiconductor field-effect transistor-based frequency doubler, the corresponding phase shift of the at least one of the at least two even harmonic signals with respect to the fundamental signal is between −180 and 0 degrees, for example between −135 and −45 degrees, between −95 and −85 degrees, or −90 degrees. As an alternative, in the case of an n-type metal-oxide semiconductor field-effect transistor-based frequency doubler, the corresponding phase shift of the at least one of the at least two even harmonic signals with respect to the fundamental signal is between 0 and 180 degrees, for example between 45 and 135 degrees, between 85 and 95 degrees, or 90 degrees. Conversion gain can further be increased in an efficient manner.

According to a further example of the first aspect of the disclosure, the odd harmonic generation device comprises a filter. In this context, the filter is configured to filter out the corresponding undesired signal portions with respect to the desired odd harmonic signal especially after the mixing with the aid of the mixer. Accuracy can further be increased.

According to a further example of the first aspect of the disclosure, the odd harmonic generation device is a third harmonic generation device. In this context, the at least two even harmonic signals comprise or are a second and a fourth harmonic signal. In addition to this, the desired odd harmonic signal is a desired third harmonic signal. Complexity can further be reduced, which leads to an increased efficiency.

In this context of a third harmonic generation device, the fundamental signal and the second harmonic signal can be shifted in phase with the aid of the phase shifting unit. In addition to this or as an alternative, the fourth harmonic signal may be generated by the transconductance stage.

According to a further example of the first aspect of the disclosure, the odd harmonic generation device is implemented in complementary metal-oxide semiconductor technology, for example 28 nanometers complementary metal-oxide semiconductor technology. Abroad spectrum of usage scenarios can be provided.

According to a further example of the first aspect of the disclosure, the odd harmonic generation device comprises a first field-effect transistor, for example a p-type metal-oxide semiconductor field-effect transistor, a second field-effect transistor, for example a p-type metal-oxide semiconductor field-effect transistor, a third field-effect transistor, for example an n-type metal-oxide semiconductor field-effect transistor, a first inductance, and a first capacitance. In this context, the source terminal of the first field-effect transistor is connected to a first potential and the source terminal of the second field-effect transistor is connected to the first potential, wherein the drain terminal of the first field-effect transistor is connected to a second potential and the drain terminal of the second field-effect transistor is connected to the second potential. Furthermore, a first terminal of the first inductance is connected to the second potential and a second terminal of the first inductance is connected to a third potential, for example a ground potential, wherein a first terminal of the first capacitance is connected to the second potential and a second terminal of the first capacitance is connected to the gate terminal of the third field-effect transistor. In addition to this, the source terminal of the third field-effect transistor is connected to the third potential. The odd harmonic generation device can be implemented in a highly efficient manner.

According to a further example of the first aspect of the disclosure, the odd harmonic generation device comprises a fourth field-effect transistor, for example an n-type metal-oxide semiconductor field-effect transistor, a fifth field-effect transistor, for example an n-type metal-oxide semiconductor field-effect transistor, a second inductance, and a second capacitance. In this context, the source terminal of the fourth field-effect transistor is connected to a fourth potential and the source terminal of the fifth field-effect transistor is connected to the fourth potential, wherein the drain terminal of the third field-effect transistor is connected to the fourth potential, wherein a first terminal of the second inductance is connected to the fourth potential and a second terminal of the second inductance is connected to a first terminal of the second capacitance, wherein a second terminal of the second capacitance is connected to the third potential. Moreover, the fundamental signal, for example a positive version of the fundamental signal, is provided for the gate terminal of the first field-effect transistor and for the gate terminal of the fourth field-effect transistor. In addition to this, the fundamental signal, for example a negative version of the fundamental signal, is provided for the gate terminal of the second field-effect transistor and for the gate terminal of the fifth field-effect transistor. Efficiency can further be increased.

For stabilization and/or insulation, the odd harmonic generation device may comprise a third capacitance, and a fourth capacitance. In this context, the gate terminal of the fourth field-effect transistor may be coupled to the drain terminal of the fifth field-effect transistor via the third capacitance, wherein the gate terminal of the fifth field-effect transistor may be coupled to the drain terminal of the fourth field-effect transistor via the fourth capacitance, for example having the same capacitance value as the third capacitance.

As an alternative, with respect to the above-mentioned provision of the fundamental signal or the positive/negative version thereof, respectively, it is noted that the fundamental signal may be provided for the gate terminal of the first field-effect transistor and for the gate terminal of the second field-effect transistor with different polarities. In this context, additionally or alternatively, the fundamental signal may be provided for the gate terminal of the fourth field-effect transistor and for the gate terminal of the fifth field-effect transistor with different polarities.

According to a second aspect of the disclosure, an odd harmonic generation method is provided. The odd harmonic generation method comprises the steps of generating at least two even harmonic signals on the basis of a fundamental signal, and mixing the fundamental harmonic signal with at least two of the at least two even harmonic signals in order to generate a desired odd harmonic signal. A particularly high conversion gain and efficiency can be achieved.

According to a first example of the second aspect of the disclosure, the at least two even harmonic signals are generated in a manner that at least one of the fundamental signal and the at least two even harmonic signals, for example at least one of the at least two even harmonic signals, are shifted in phase before the step of mixing. Alternatively, the odd harmonic generation method comprises the step of shifting at least one of the fundamental signal and the at least two even harmonic signals, for example at least one of the at least two even harmonic signals, in phase before the step of mixing. For example, an I/Q signal generation is not required, which leads to an increased efficiency.

According to a second example of the second aspect of the disclosure, the at least two even harmonic signals are shifted in phase with regard to each other in a manner that corresponding signal portions are constructively added with respect to the desired odd harmonic signal after the step of mixing. Conversion gain can further be increased.

According to a further example of the second aspect of the disclosure, the odd harmonic generation method comprises the step of filtering out undesired signal portions with respect to the desired odd harmonic signal after the step of mixing. Accuracy can further be increased.

BRIEF DESCRIPTION OF THE FIGURES

The above, as well as additional, features will be better understood through the following illustrative and non-limiting detailed description of example embodiments, with reference to the appended drawings.

Exemplary embodiments of the disclosure are now further explained with respect to the drawings by way of example only, and not for limitation. In the drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
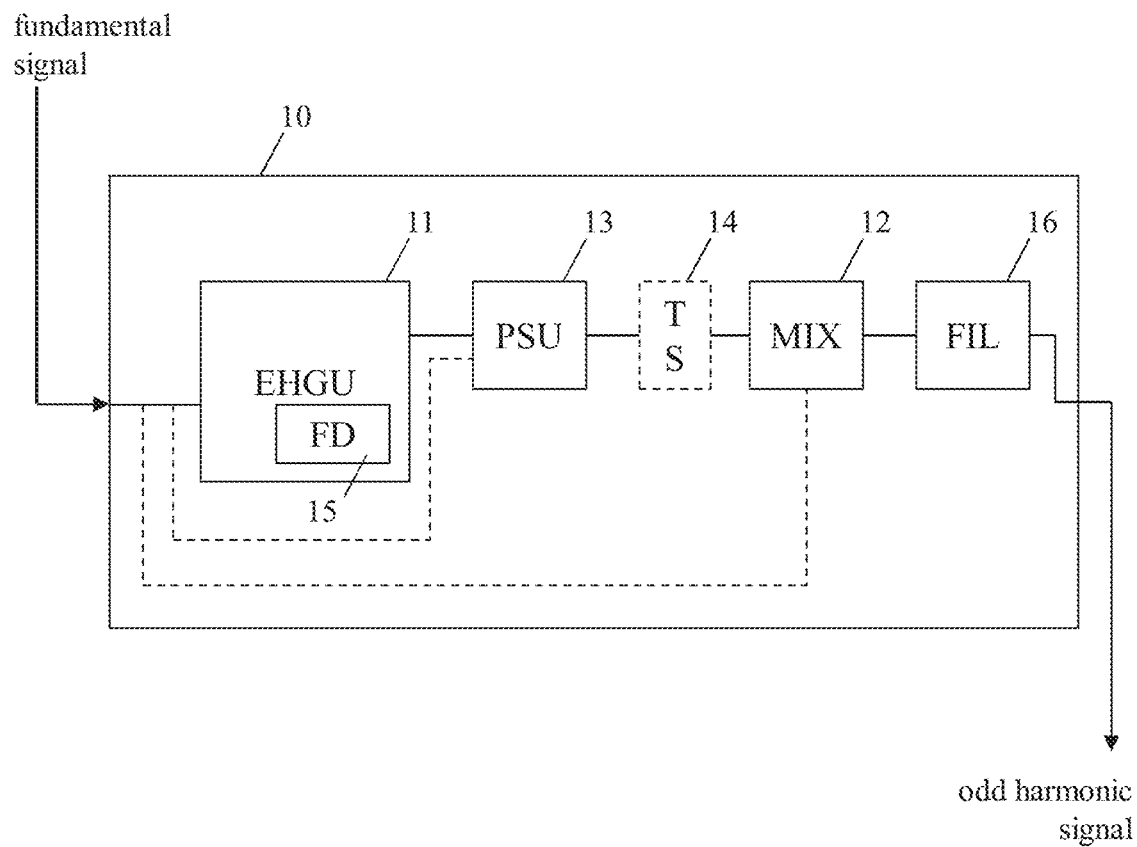
FIG. 1 shows an odd harmonic generation device, according to an example.

FIG. 1 shows an odd harmonic generation device 10. According to FIG. 1, the odd harmonic generation device 10 comprises an even harmonic generation unit 11 and a mixer 12.

In this context, the even harmonic generation unit 11 is configured to generate at least two even harmonic signals on the basis of a fundamental signal. Additionally, the mixer 12 is configured to mix the fundamental signal with at least two of the at least two even harmonic signals in order to generate a desired odd harmonic signal.

As it can further be seen from FIG. 1, the odd harmonic generation device 10 comprises a phase shifting unit 13. The phase shifting unit 13 is configured to shift at least one of the fundamental signal and the at least two even harmonic signals, for example at least one of the at least two even harmonic signals, in phase before the mixing with the aid of the mixer 12.

For example, the at least two even harmonic signals are shifted in phase with regard to each other in a manner that corresponding signal portions are constructively added with respect to the desired odd harmonic signal after the mixing at the output of the mixer 12. It is further noted that the odd harmonic generation device 10 may comprise a transconductance stage 14. In this context, the transconductance stage 14 is configured to couple the even harmonic generation unit 11 to the mixer 12.

In addition to this or as an alternative, the transconductance stage 14 is configured to generate at least one extra harmonic, for example at least one even extra harmonic, of its respective input. Further additionally or further alternatively, the transconductance stage 14 is configured to amplify at least one component, for example at least one even harmonic component, of its respective input.

Furthermore, the even harmonic generation unit 11 comprises a frequency doubler 15, for example a transistor-based frequency doubler, a field-effect transistor-based frequency doubler, or a p-type or n-type metal-oxide semiconductor field-effect transistor-based frequency doubler.

It is noted that exemplary embodiments of such a frequency doubler are explained in greater detail on the basis of FIG. 3A and FIG. 3B below.

In the case of a p-type metal-oxide semiconductor field-effect transistor-based frequency doubler, the corresponding phase shift with respect to the at least one of the fundamental signal and the at least two even harmonic signals, for example with respect to the at least one of the at least two even harmonic signals, is between −180 and 0 degrees, for example between −135 and −45 degrees, between −95 and −85 degrees, or −90 degrees.

In the case of an n-type metal-oxide semiconductor field-effect transistor-based frequency doubler, the corresponding phase shift with respect to the at least one of the fundamental signal and the at least two even harmonic signals, for example, with respect to the at least one of the at least two even harmonic signals, can be between 0 and 180 degrees, between 45 and 135 degrees, between 85 and 95 degrees, or 90 degrees.

As it can further be seen from FIG. 1, the odd harmonic generation device 10 comprises a filter 16. In this context, the filter 16 is configured to filter out the corresponding undesired signal portions with respect to the desired odd harmonic signal for example after the mixing with the aid of the mixer 12.

Within examples, the odd harmonic generation device 10 is a third harmonic generation device. In this context, the at least two even harmonic signals may comprise or be a second and a fourth harmonic signal. In addition to this, the desired odd harmonic signal may be a desired third harmonic signal.

In this context of a third harmonic generation device, the fundamental signal and the second harmonic signal can be shifted in phase especially with the aid of the phase shifting unit 13. In addition to this or as an alternative, the fourth harmonic signal may be generated by the transconductance stage 14.

It is noted that an exemplary embodiment of such a third harmonic generation device is shown in greater detail in FIG. 2, which will be explained below.

The odd harmonic generation device 10 can be implemented in complementary metal-oxide semiconductor technology, for example 28 nanometers complementary metal-oxide semiconductor technology. This can apply to the embodiments according to FIG. 2, FIG. 3A, and FIG. 3B.

Figure 2:
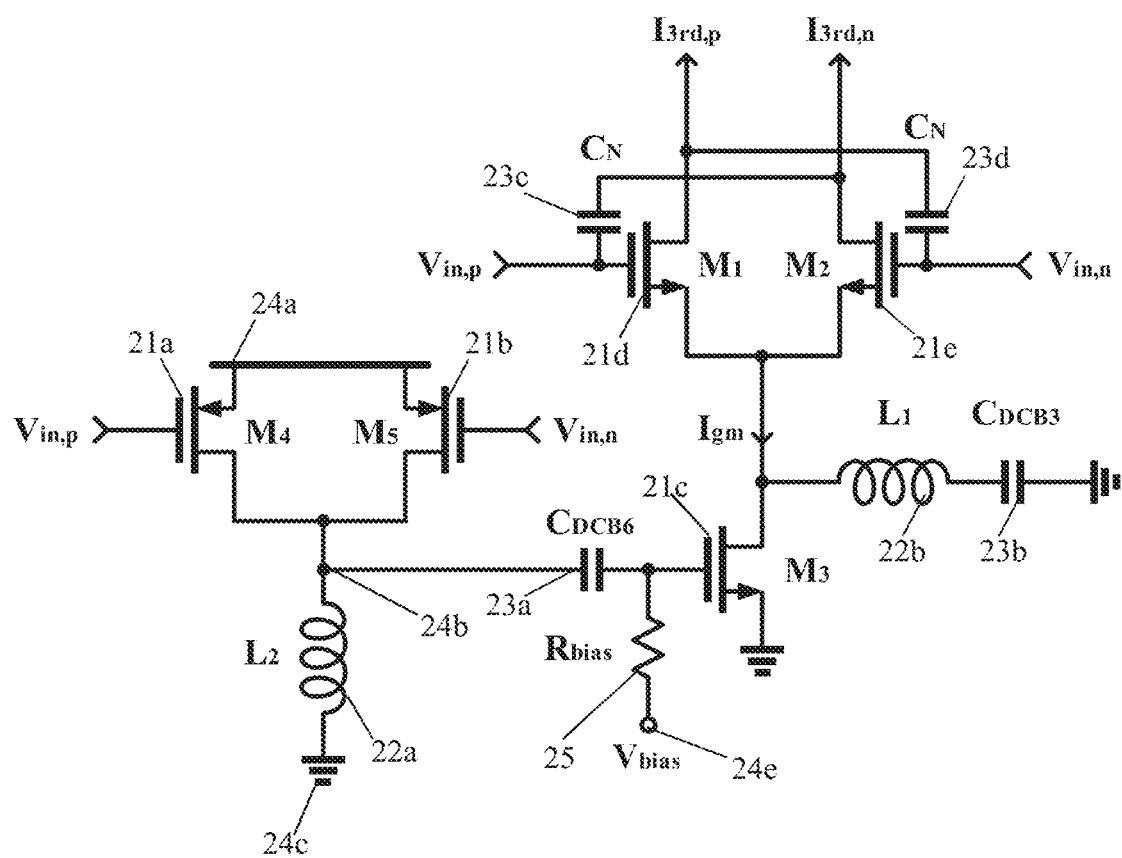
FIG. 2 shows a third harmonic generation device, according to an example.

Now, with respect to FIG. 2, a further embodiment of an odd harmonic generation device is illustrated. More specifically, a third harmonic generation device is provided.

The third harmonic generation device comprises a first field-effect transistor 21a, for example a p-type metal-oxide semiconductor field-effect transistor, a second field-effect transistor 21b, for example a p-type metal-oxide semiconductor field-effect transistor, a third field-effect transistor 21c, for example an n-type metal-oxide semiconductor field-effect transistor, a first inductance 22a, and a first capacitance 23a. In this context, the source terminal of the first field-effect transistor 21a is connected to a first potential 24a, for example supply potential, and the source terminal of the second field-effect transistor 21b is connected the first potential 24a.

Additionally, the drain terminal of the first field-effect transistor 21a is connected to a second potential 24b and the drain terminal of the second field-effect transistor 21b is connected to the second potential 24b, wherein a first terminal of the first inductance 22a is connected to the second potential 24b and a second terminal of the first inductance 22a is connected to a third potential 24c, for example a ground potential. Furthermore, a first terminal of the first capacitance 23a is connected to the second potential 24b and a second terminal of the first capacitance 23a is connected to the gate terminal of the third field-effect transistor 21c, wherein the source terminal of the third field-effect transistor 21c is connected to the third potential 24c.

As it can further be seen from FIG. 2, the third harmonic generation device comprises a fourth field-effect transistor 21d, for example an n-type metal-oxide semiconductor field-effect transistor, a fifth field-effect transistor 21e, for example an n-type metal-oxide semiconductor field-effect transistor, a second inductance 22b, a second capacitance 23b, a third capacitance 23c, and a fourth capacitance 23d.

In this context, the source terminal of the fourth field-effect transistor 21d is connected to a fourth potential 24d and the source terminal of the fifth field-effect transistor 21e is connected to the fourth potential 24d.

Additionally, the drain terminal of the third field-effect transistor 21c is connected to the fourth potential 24d, wherein a first terminal of the second inductance 22b is connected to the fourth potential 24d and a second terminal of the second inductance 22b is connected to a first terminal of the second capacitance 23b. Furthermore, a second terminal of the second capacitance 23b is connected to the third potential 24c.

Moreover, the gate terminal of the fourth field-effect transistor 21d is coupled to the drain terminal of the fifth field-effect transistor 21e via the third capacitance 23c, wherein the gate terminal of the fifth field-effect transistor 21e is coupled to the drain terminal of the fourth field-effect transistor 21d via the fourth capacitance 23d being exemplarily of the same capacitance value as the third capacitance 23c.

With respect to the third capacitance 23c and the fourth capacitance 23d, it is noted that these capacitances can serve for stabilization and/or insulation.

As it can further be seen, the fundamental signal, for example a fundamental voltage signal, for example a positive version of the fundamental signal, is provided for the gate terminal of the first field-effect transistor 21a and for the gate terminal of the fourth field-effect transistor 21d. In addition to this, the fundamental signal, for example a fundamental voltage signal, for example a negative version of the fundamental signal, is provided for the gate terminal of the second field-effect transistor 21b and for the gate terminal of the fifth field-effect transistor 21e.

It is further noted that the odd, for example third, harmonic generation device may comprise a resistance 25. In this context, a first terminal of the resistance 25 is connected to the gate terminal of the third field-effect transistor 21c, wherein a second terminal of the resistance 25 is connected to a fifth potential 24e, for example a bias potential.

In accordance with FIG. 2, the desired odd harmonic signal, for example the desired third harmonic signal, is provided as a current at the drain terminal of the fourth field-effect transistor 21d or at the drain terminal of the fifth field-effect transistor 21e. In this context, the drain terminal of the fourth field-effect transistor 21d for example provides a positive version of the third harmonic current, whereas the drain terminal of the fifth field-effect transistor 21e for example provides a negative version of the third harmonic current.

It is further noted that an even harmonic generation unit in the sense of the disclosure such as the even harmonic generation unit 11 may comprise at least two field-effect transistors such as the first and the second field-effect transistor 21a, 21b. In addition to this or as an alternative, a frequency doubler in the sense of the disclosure such as the frequency doubler 15 may comprise at least two field-effect transistors such as the first and the second field-effect transistor 21a, 21b.

Furthermore, a transconductance stage in the sense of the disclosure such as the transconductance stage 14 may comprise at least one field-effect transistor such as the third field-effect transistor 21c. Moreover, a mixer in the sense of the disclosure such as the mixer 12 may comprise at least two field-effect transistors such as the fourth and the fifth field-effect transistor 21d, 21e, for example at least two field-effect transistors such as the fourth and the fifth field-effect transistor 21d, 21e and at least two capacitances such as the third and the fourth capacitance 23c, 23d.

In this context, the fourth harmonic signal can be generated by the transconductance stage, for example by or with the involvement of the third field-effect transistor 21c.

It is noted that the third harmonic generation device according to FIG. 2 can improve its conversion gain by having a proper phase relationship between the respective input voltage swing of the mixer and the transconductance stage and/or by introducing a frequency doubler, for example the p-type metal-oxide semiconductor field-effect transistor-based frequency doubler.

For an analysis of the third harmonic generation device according to FIG. 2, the following signals are defined:

The signal at the gate terminal of the third field-effect transistor 21c or the transconductance (gm) stage, respectively, can be expressed as $$A_{gm} \sin(2\omega_0 t+\theta),$$

wherein $A_{gm}$ denotes the amplitude of the signal or the respective transconductance stage voltage amplitude, wherein $\omega_0$ denotes the angular frequency of the respective fundamental signal, and wherein $\theta$ denotes the respective phase shift especially of the input voltage.

Furthermore, the signal at the gate terminal of the fourth and the fifth field-effect transistor 21d, 21e or the mixer, respectively, can be expressed as $$A_{mix} \sin(\omega_0 t),$$

wherein $A_{mix}$ denotes the amplitude of the signal or the respective input voltage amplitude, and wherein, as already mentioned above, $\omega_0$ denotes the angular frequency of the respective fundamental signal.

Moreover, the current $I_{gm}$ provided by the source terminals of the fourth and the fifth field-effect transistor 21d, 21e can be expressed as $$I_{gm}(t)=K_1 \sin(2\omega_0 t+\theta)-K_2 \cos(4\omega_0 t+2\theta),$$

wherein $K_1$ denotes the respective first order coefficient of the transconductance stage, for example the respective positive first order coefficient of the transconductance stage, wherein $K_2$ denotes the respective second order coefficient of the transconductance stage, for example the respective positive second order coefficient of the transconductance stage, wherein, as already mentioned above, $\theta$ denotes the respective phase shift especially of the input voltage, and wherein, as already mentioned above, $\omega_0$ denotes the angular frequency of the respective fundamental signal.

Now, the third harmonic current $I_{3rd}$, especially generated from the up- and down-converted fundamental and the second harmonic current of the transconductance stage, can be written as $$I_{3rd}(t) = $$
$$A_{mix} \sin(\omega_0 t) \cdot i_{gm}(t) = \underbrace{\frac{A_{mix}K_2}{2}\sin(3\omega_0 t + 2\theta) - \frac{A_{mix}K_1}{2}\cos(3\omega_0 t + \theta)}_{\text{3rd harmonic current}} + $$
$$\underbrace{\frac{A_{mix}K_1}{2}\cos(\omega_0 t + \theta) - \frac{A_{mix}K_2}{2}\sin(5\omega_0 t + 2\theta)}_{\text{filtered out}}.$$

In this context, it is noted that the constructive third harmonic current generation can for example be achieved by a applying a −90 degrees phase-shifted signal to the transconductance stage.

Figure 3A:
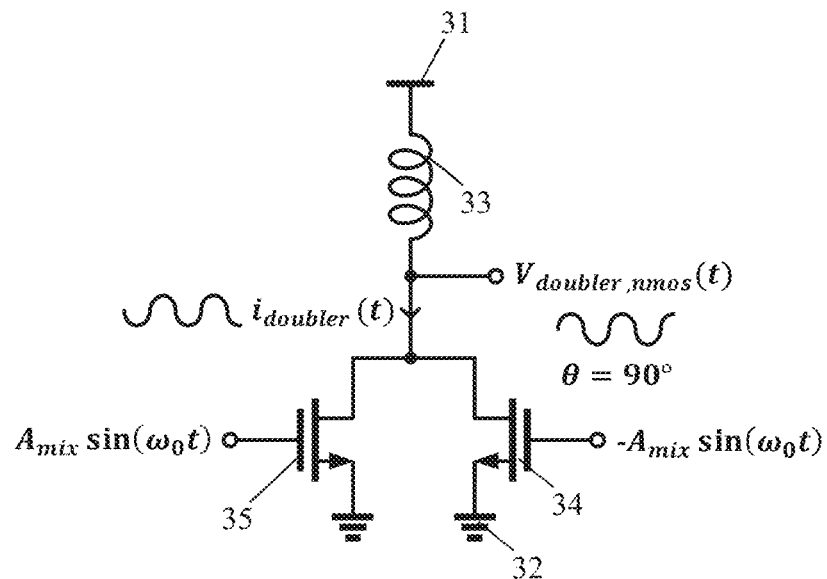
FIG. 3A shows a push-push frequency doubler based on two n-type metal-oxide semiconductor field-effect transistors, according to an example.
Figure 3B:
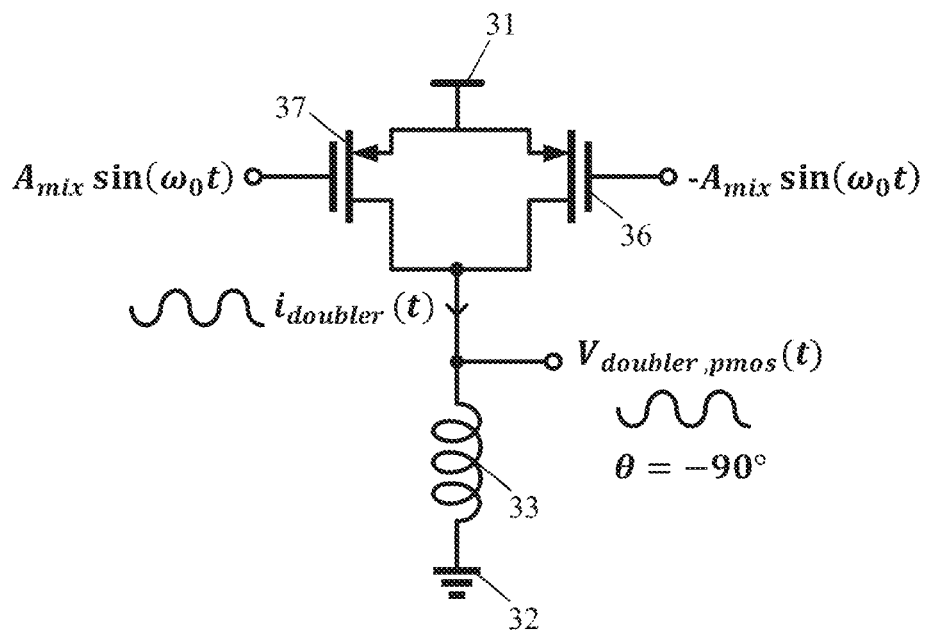
FIG. 3B shows a push-push frequency doubler based on two p-type metal-oxide semiconductor field-effect transistors, according to an example.

The required −90 degrees phase-shifted voltage swing to the transconductance stage is for example generated by the p-type metal-oxide semiconductor field-effect transistor push-push frequency doubler shown in FIG. 3B. Due to the usage of the doubler, it is noted that a phase shifting unit is not required.

The respective drain current of the frequency doubler can be expressed as $$i_{doubler}(t)=K_{0,doubler}-K_{2,doubler}\cos(2\omega_0 t),$$

wherein $K_{0,doubler}$ denotes the coefficient, for example the positive coefficient, for the respective direct current, wherein $K_{2,doubler}$ denotes the coefficient, for example the positive coefficient, for the respective second order harmonic current, and wherein, as already mentioned above, $\omega_0$ denotes the angular frequency of the respective fundamental signal.

As the sign inversion from the current to voltage inversion does not happen in case of the p-type metal-oxide semiconductor field-effect transistor-based frequency doubler of FIG. 3B, the respective voltage swing applied to the transconductance stage with respect to an n-type metal-oxide semiconductor field-effect transistor-based push-push frequency doubler according to FIG. 3A can be written as:

$$V_{doubler,nmos}(t)=-K_{2,doubler}'\cos(2\omega_0 t)$$

wherein $K_{2,doubler}'$ denotes a second harmonic coefficient, for example a positive second harmonic coefficient.

Thus, the third harmonic generation device according to FIG. 2 especially applies the −90 degrees phase-shifted signal (or the 90 degrees phase-shifted signal in the case of the n-type metal-oxide semiconductor field-effect transistor-based frequency doubler such as the n-type push-push doubler of FIG. 3A) without introducing a lossy and bulky I/Q signal generator while increasing the respective conversion gain for example by having a proper phase relationship between the respective up- and down-converted third harmonics at the output.

Again, with respect to FIG. 3A, it is noted that the n-type push-push frequency doubler comprises two n-type metal-oxide semiconductor field-effect transistors 34, 35, and an inductance 33. In this context, the drain terminals of the two field-effect transistors 34, 35 are connected to a first potential, for example supply potential 31, via the inductance 33. Furthermore, the source terminals of the two field-effect transistors 34, 35 are connected to a second potential, for example ground potential 32.

With respect to FIG. 3B, it is noted that the p-type push-push frequency doubler comprises two p-type metal-oxide semiconductor field-effect transistors 36, 37, and an inductance 33. In this context, the source terminals of the two field-effect transistors 36, 37 are connected to a first potential, for example supply potential 31. Furthermore, the drain terminals of the two field-effect transistors 36, 37 are connected to a second potential, for example ground potential 32, via the inductance 33.

Figure 4:
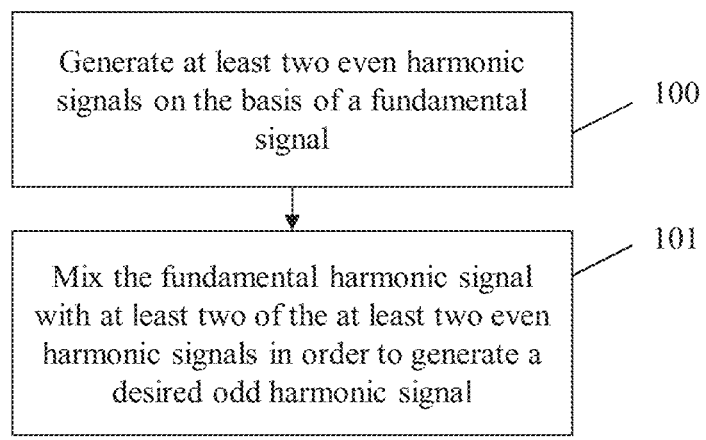
FIG. 4 shows a flow chart of a method, according to an example.

Finally, FIG. 4 shows a flow chart of an odd harmonic generation method. According to a first step 100, the odd harmonic generation method comprises generating at least two even harmonic signals on the basis of a fundamental signal. In addition to this, in accordance with a second step 101, the method comprises mixing the fundamental harmonic signal with at least two of the at least two even harmonic signals in order to generate a desired odd harmonic signal.

The odd harmonic generation method can include the step of shifting at least one of the fundamental signal and the at least two even harmonic signals, for example at least one of the at least two even harmonic signals, in phase before the step of mixing. In this context, the at least two even harmonic signals may for example be shifted in phase with regard to each other in a manner that corresponding signal portions are constructively added with respect to the desired odd harmonic signal after the step of mixing.

The odd harmonic generation method can include the step of filtering out undesired signal portions with respect to the desired odd harmonic signal after the step of mixing.

While various embodiments of the present disclosure have been described above, it should be understood that they have been presented by way of example only, and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A device comprising:
an even harmonic generation unit configured to generate two even order harmonic signals based on a fundamental signal, and
a mixer configured to mix the fundamental signal with the two even order harmonic signals to generate an odd order harmonic signal,
wherein the two even order harmonic signals comprise a second order harmonic signal and a fourth order harmonic signal, and
wherein the odd order harmonic signal is a third order harmonic signal.

2. A device comprising:
an even harmonic generation unit configured to generate two even order harmonic signals based on a fundamental signal, and
a mixer configured to mix the fundamental signal with the two even order harmonic signals to generate an odd order harmonic signal,
wherein the even harmonic generation unit is configured to phase shift the fundamental signal before the mixer mixes the fundamental signal.

3. A device comprising:
an even harmonic generation unit configured to generate two even order harmonic signals based on a fundamental signal, and
a mixer configured to mix the fundamental signal with the two even order harmonic signals to generate an odd order harmonic signal,
wherein the even harmonic generation unit is configured to phase shift at least one harmonic signal of the two even order harmonic signals before the mixer mixes the two even order harmonic signals.

4. A device comprising:
an even harmonic generation unit configured to generate two even order harmonic signals based on a fundamental signal,
a mixer configured to mix the fundamental signal with the two even order harmonic signals to generate an odd order harmonic signal, and
a phase shifting unit, wherein the phase shifting unit is configured to phase shift the fundamental signal before the mixer mixes the fundamental signal.

5. A device comprising:
an even harmonic generation unit configured to generate two even order harmonic signals based on a fundamental signal,
a mixer configured to mix the fundamental signal with the two even order harmonic signals to generate an odd order harmonic signal, and
a phase shifting unit, wherein the phase shifting unit is configured to phase shift at least one harmonic signal of the two even order harmonic signals before the mixer mixes the two even order harmonic signals.

6. A device comprising:
an even harmonic generation unit configured to generate two even order harmonic signals based on a fundamental signal,
a mixer configured to mix the fundamental signal with the two even order harmonic signals to generate an odd order harmonic signal, and
a phase shifting unit configured to phase shift the two even order harmonic signals with regard to each other such that corresponding signal portions of the two even order harmonic signals are constructively added with respect to the odd order harmonic signal at an output of the mixer.

7. A device comprising:
an even harmonic generation unit configured to generate two even order harmonic signals based on a fundamental signal,
a mixer configured to mix the fundamental signal with the two even order harmonic signals to generate an odd order harmonic signal, and
a transconductance stage,
wherein the transconductance stage is configured to couple the even harmonic generation unit to the mixer, and/or
wherein the transconductance stage is configured to generate one even order harmonic of an input of the transconductance stage, and/or
wherein the transconductance stage is configured to amplify an even order harmonic component of the input of the transconductance stage.

8. A device comprising:
an even harmonic generation unit configured to generate two even order harmonic signals based on a fundamental signal, and
a mixer configured to mix the fundamental signal with the two even order harmonic signals to generate an odd order harmonic signal,
wherein the even harmonic generation unit comprises a frequency doubler,
wherein the frequency doubler is a p-type metal-oxide semiconductor field-effect transistor-based frequency doubler, wherein a phase shift of a harmonic signal of the two even order harmonic signals with respect to the fundamental signal is between −95 and −85 degrees.

9. A device comprising:
an even harmonic generation unit configured to generate two even order harmonic signals based on a fundamental signal, and
a mixer configured to mix the fundamental signal with the two even order harmonic signals to generate an odd order harmonic signal,
wherein the even harmonic generation unit comprises a frequency doubler,
wherein the frequency doubler is an n-type metal-oxide semiconductor field-effect transistor-based frequency doubler, wherein a phase shift of a harmonic signal of the two even order harmonic signals with respect to the fundamental signal is between 95 and 85 degrees.

10. A device comprising:
an even harmonic generation unit configured to generate two even order harmonic signals based on a fundamental signal,
a mixer configured to mix the fundamental signal with the two even order harmonic signals to generate an odd order harmonic signal, and
a filter configured to filter out signal portions with respect to the odd order harmonic signal downstream of the mixer.

11. The device according to claim 1, wherein the device is implemented in complementary metal-oxide semiconductor technology.

12. A device comprising:
an even harmonic generation unit configured to generate two even order harmonic signals based on a fundamental signal, and
a mixer configured to mix the fundamental signal with the two even order harmonic signals to generate an odd order harmonic signal,
wherein the device comprises a first field-effect transistor, a second field-effect transistor, a third field-effect transistor, a first inductance, and a first capacitance,
wherein a first source terminal of the first field-effect transistor is connected to a first potential and a second source terminal of the second field-effect transistor is connected the first potential, wherein a first drain terminal of the first field-effect transistor is connected to a second potential and a second drain terminal of the second field-effect transistor is connected to the second potential,
wherein a first terminal of the first inductance is connected to the second potential and a second terminal of the first inductance is connected to a third potential,
wherein a first terminal of the first capacitance is connected to the second potential and a second terminal of the first capacitance is connected to a third gate terminal of the third field-effect transistor, and
wherein a third source terminal of the third field-effect transistor is connected to the third potential.

13. The device according to claim 12,
wherein the device comprises a fourth field-effect transistor, a fifth field-effect transistor, a second inductance, and a second capacitance,
wherein a fourth source terminal of the fourth field-effect transistor is connected to a fourth potential and a fifth source terminal of the fifth field-effect transistor is connected to the fourth potential, wherein a third drain terminal of the third field-effect transistor is connected to the fourth potential,
wherein a first terminal of the second inductance is connected to the fourth potential and a second terminal of the second inductance is connected to a first terminal of the second capacitance,
wherein a second terminal of the second capacitance is connected to the third potential,
wherein a positive version of the fundamental signal is provided for a first gate terminal of the first field-effect transistor and for a fourth gate terminal of the fourth field-effect transistor, and
wherein a negative version of the fundamental signal is provided for a second gate terminal of the second field-effect transistor and for a fifth gate terminal of the fifth field-effect transistor.

14. A method comprising:
generating two even order harmonic signals based on a fundamental signal; and
mixing the fundamental signal with the two even order harmonic signals to generate an odd order harmonic signal,
wherein the two even order harmonic signals comprise a second order harmonic signal and a fourth order harmonic signal, and
wherein the odd order harmonic signal is a third order harmonic signal.

15. A method comprising:
generating two even order harmonic signals based on a fundamental signal; and
mixing the fundamental signal with the two even order harmonic signals to generate an odd order harmonic signal,
wherein generating the two even order harmonic signals comprises generating the two even order harmonic signals such that the fundamental signal or at least one harmonic signal of the two even order harmonic signals are shifted in phase before the mixing.

16. A method comprising:
generating two even order harmonic signals based on a fundamental signal; and
mixing the fundamental signal with the two even order harmonic signals to generate an odd order harmonic signal,
wherein generating the two even order harmonic signals comprises generating the two even order harmonic signals such that the fundamental signal and the two even order harmonic signals are shifted in phase before the mixing.

17. A method comprising:
generating two even order harmonic signals based on a fundamental signal; and
mixing the fundamental signal with the two even order harmonic signals to generate an odd order harmonic signal,
wherein the two even order harmonic signals are shifted in phase with regard to each other such that signal portions are constructively added with respect to the odd order harmonic signal after the mixing.

18. The method according to claim 14, further comprising filtering out undesired signal portions with respect to the odd order harmonic signal after the mixing.

* * * * *